United States Patent
Morimoto et al.

(10) Patent No.: US 9,939,465 B2
(45) Date of Patent: Apr. 10, 2018

(54) ELECTRIC CURRENT DETECTOR

(71) Applicant: SUMIDA CORPORATION, Tokyo (JP)

(72) Inventors: Yasunori Morimoto, Natori (JP); Morihiro Kuroda, Natori (JP); Seiji Shimizu, Natori (JP); Shuichi Kikuchi, Natori (JP); Tomomi Nakatsuka, Natori (JP)

(73) Assignee: Sumida Corporation (JP)

( * ) Notice: Subject to any disclaimer, the term of this patent is extended or adjusted under 35 U.S.C. 154(b) by 13 days.

(21) Appl. No.: 15/133,761

(22) Filed: Apr. 20, 2016

(65) Prior Publication Data

US 2016/0313374 A1 Oct. 27, 2016

(30) Foreign Application Priority Data

Apr. 24, 2015 (JP) .................................. 2015-089092
Feb. 26, 2016 (JP) .................................. 2016-034974

(51) Int. Cl.
*G01R 15/18* (2006.01)
*G01R 19/00* (2006.01)
(Continued)

(52) U.S. Cl.
CPC ....... *G01R 15/185* (2013.01); *G01R 19/0092* (2013.01); *G01R 33/0011* (2013.01); *H01F 3/14* (2013.01)

(58) Field of Classification Search
CPC . G01R 1/20; G01R 1/22; G01R 11/06; G01R 19/20; G01R 33/0283; G01R 15/20;
(Continued)

(56) References Cited

U.S. PATENT DOCUMENTS 6,411,078 B1 * 6/2002 Nakagawa ........... G01R 15/183
324/117 H
7,193,408 B2 * 3/2007 Cattaneo ................ G01R 15/20
324/117 R
(Continued)

FOREIGN PATENT DOCUMENTS

EP 1450176 A1 8/2004
JP 2008-224260 A 9/2008
(Continued)

OTHER PUBLICATIONS

Extended European Search Report for EP Application No. 16166471.9, dated Sep. 8, 2016 (13 pages).

*Primary Examiner* — Tung X Nguyen
(74) *Attorney, Agent, or Firm* — Harness, Dickey & Pierce, P.L.C.

(57) ABSTRACT

An electric current detector which is mountable on a circuit board on which there is mounted a fluxgate-type magnetic sensor IC chip which detects magnetic flux for electric current detection, including: a substantially ring-shaped core which forms a magnetic-path for magnetic flux induced by detection-target electric current, wherein the core includes a gap which is arranged to become substantially parallel with respect to the circuit board when mounting the aforesaid electric current detector on the circuit board and which is at a place positioned on or on the upper side of the magnetic sensor IC chip in the magnetic-path when mounting the aforesaid electric current detector on the circuit board.

13 Claims, 10 Drawing Sheets

(51) Int. Cl.
*G01R 33/00* (2006.01)
*H01F 3/14* (2006.01)

(58) Field of Classification Search
CPC .................. G01R 21/08; G01R 33/075; G05G 2009/04755; G06G 7/162
See application file for complete search history.

(56) References Cited

U.S. PATENT DOCUMENTS

| | | |
|---|---|---|
| 2010/0301852 A1 | 12/2010 | Teppan et al. |
| 2012/0306486 A1 | 12/2012 | Racz et al. |
| 2014/0218018 A1 | 8/2014 | Ivanov et al. |
| 2014/0225593 A1* | 8/2014 | Nakajima .............. G01R 15/20 324/117 R |
| 2014/0266180 A1 | 9/2014 | Ausserlechner |

FOREIGN PATENT DOCUMENTS

| | | |
|---|---|---|
| JP | 2011-510318 A | 3/2011 |
| WO | WO-01/40812 A2 | 6/2001 |

* cited by examiner

ELECTRIC CURRENT DETECTOR

CROSS REFERENCES TO RELATED APPLICATIONS

The present invention contains subject matters related to Japanese Patent Applications JP2015-089092 and JP2016-034974 filed in the Japanese Patent Office on Apr. 24, 2015 and on Feb. 26, 2016 respectively, the entire contents of which being incorporated herein by reference.

BACKGROUND OF THE INVENTION

Field of the Invention

The present invention relates to an electric current detector.

Description of the Related Art

A certain electric current sensor based on a magnetic balance system includes a vertical-type (that is, vertically placed) annular core, a primary conductor is arranged so as to interlink with that annular core, and a compensating coil (secondary coil) is installed on the annular core. Further, a cavity is provided at the bottom portion of the annular core and a stick-shaped fluxgate-type sensor is inserted into that cavity. A control circuit board for driving that sensor is provided separately from the circuit board on which this electric current sensor is mounted and is connected to that sensor (for example, see Patent Document 1: Japanese unexamined PCT publication No. 2011-510318).

On the other hand, for the fluxgate-type magnetic sensor, other than the above-mentioned rod-shaped sensor for a special application, there exists an IC-chip shaped sensor with a built-in circuit structure as described, for example, in Patent Document 2 (US unexamined patent publication No. 2014/0218018).

SUMMARY OF THE INVENTION

However, the above-mentioned electric current sensor uses a vertical-type annular core and therefore, is configured to have a high profile, in which in the case of installing this electric current sensor on a circuit board, a space is required on the upper side of the circuit board in conformity with the height of this electric current sensor.

The present invention was invented in view of the aforesaid problem and is addressed to obtain a low-profile electric current detector.

The electric current detector relating to the present invention is an electric current detector which is mountable on a circuit board on which there is mounted a fluxgate-type magnetic sensor IC chip which detects magnetic flux for electric current detection, in which there is included a substantially ring-shaped core which forms a magnetic-path for magnetic flux induced by detection-target electric current. Then, the core includes a gap which is arranged to become substantially parallel with respect to the circuit board when mounting the aforesaid electric current detector on the circuit board and which is at a place positioned on or on the upper side of the magnetic sensor IC chip in the magnetic-path when mounting the aforesaid electric current detector on the circuit board.

According to the present invention, it is possible to obtain a low-profile electric current detector.

DESCRIPTION OF THE PREFERRED EMBODIMENTS

Hereinafter, there will be explained examples of the present invention based on the drawings.

EXAMPLE 1

Figure 1:
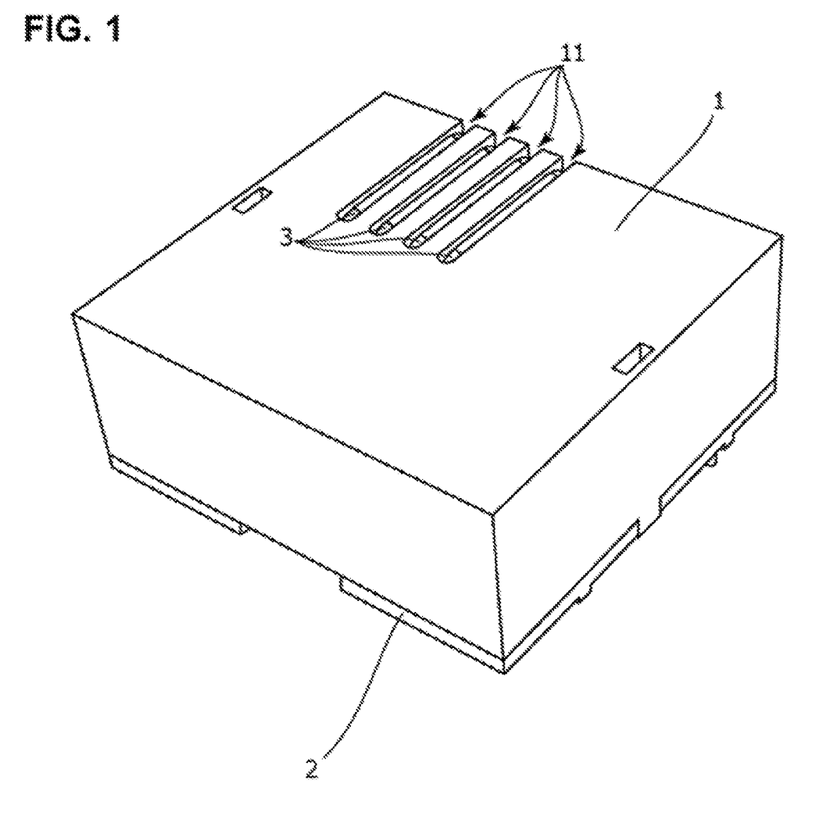
FIG. 1 is a perspective view showing an electric current detector relating to an example 1 of the present invention.
Figure 2:
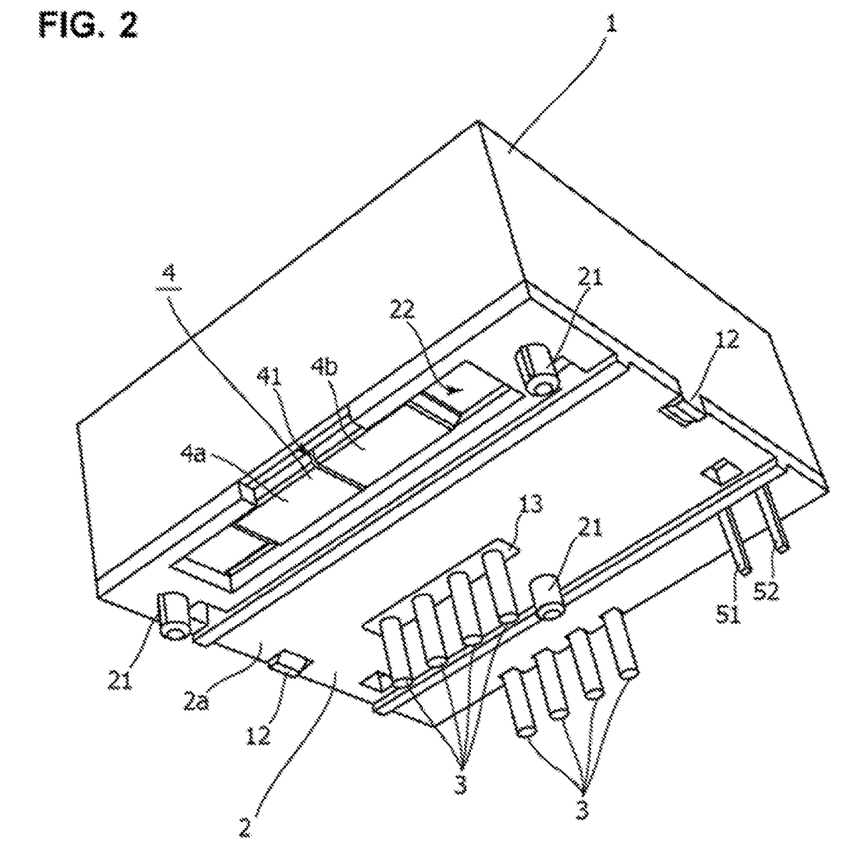
FIG. 2 is a perspective view showing a bottom surface of the electric current detector relating to the example 1 of the present invention.
Figure 3:
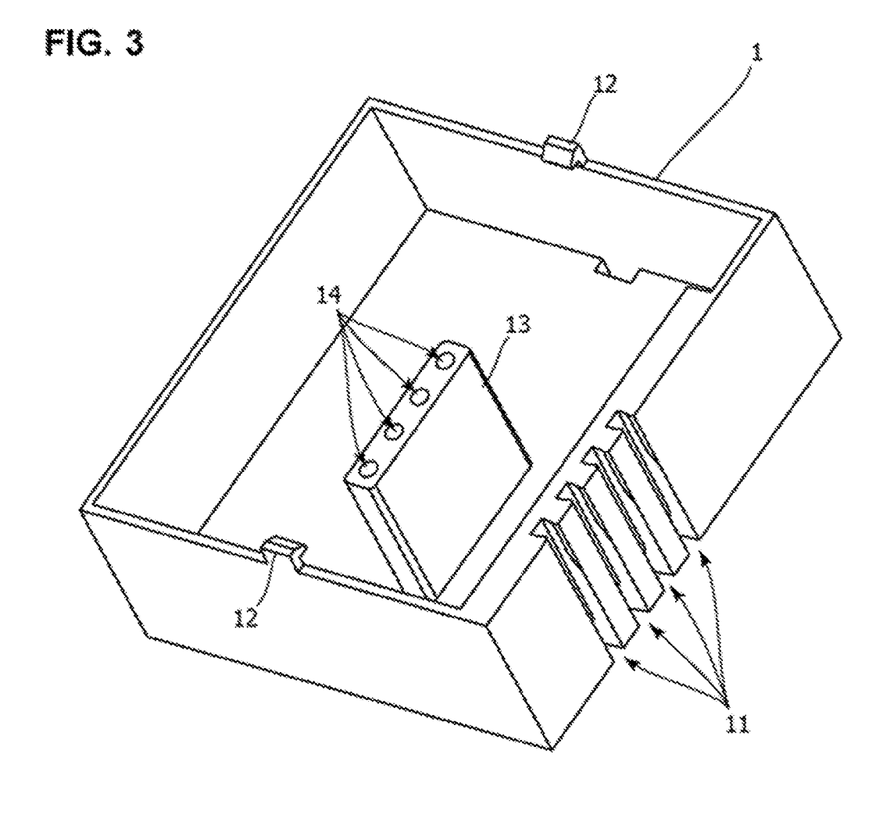
FIG. 3 is a perspective view showing an inner surface of an upper-part case member in FIG. 1.
Figure 4:
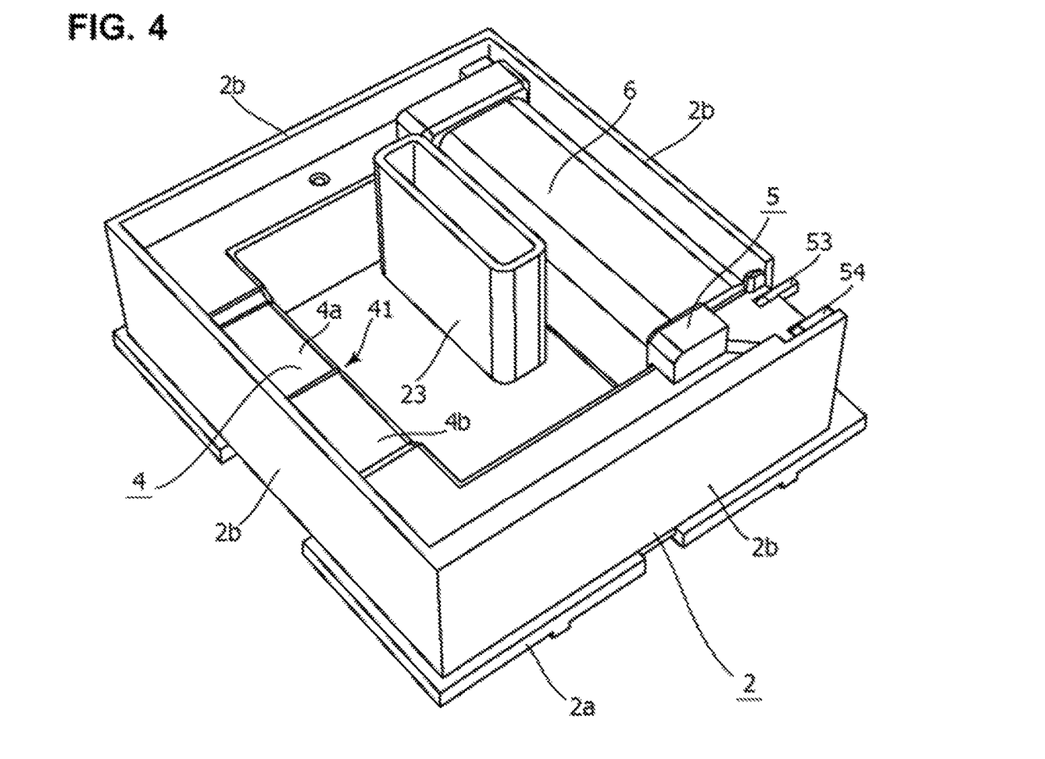
FIG. 4 is a perspective view when the upper-part case member and primary conductors of the electric current detector shown in FIG. 1 are removed.

FIG. 1 is a perspective view showing an electric current detector relating to an example 1 of the present invention. FIG. 2 is a perspective view showing a bottom surface of the electric current detector relating to the example 1 of the present invention. FIG. 3 is a perspective view showing an inner surface of an upper-part case member in FIG. 1. FIG. 4 is a perspective view when the upper-part case member and primary conductors of the electric current detector shown in FIG. 1 are removed.

The electric current detector relating to the example 1 is an electric current detector which is mountable on a circuit board on which a fluxgate-type magnetic sensor IC chip for detecting magnetic flux for the electric current detection is to be mounted.

As shown in FIGS. 1 and 2, the electric current detector relating to the example 1 includes an upper-part case member 1 and a lower-part case member 2. The upper-part case member 1 includes grooves 11 which are continuous between the upper surface thereof and one side surface thereof. In the grooves 11, primary conductors 3 are arranged.

As shown in FIG. 1, the upper-part case member 1 is mounted on the lower-part case member 2. Thus, the upper-part case member 1 and the lower-part case member 2 become integrated and constitute a case. As shown in FIG. 2, depending on a mechanism in which claw portions 12 at the distal ends on the facing two side surfaces of the upper-part case member 1 are fitted with the lower-part case member 2, the upper-part case member 1 is fixed on the lower-part case member 2.

The primary conductor 3 is a metal member through which detection-target electric current Ip conducts. In FIG. 1, the primary conductors 3 are formed by four lines, but it is allowed to employ a single line, or the number of the lines can be selected according to the request thereof. In addition, it is also allowed to employ a bus bar for the primary conductor 3.

As shown in FIG. 3, the upper-part case member 1 includes a guiding convex portion 13 which stands upright from its ceiling surface and the guiding convex portion 13 includes the same number of guide holes 14 compared with the grooves 11. The guide hole 14 is formed so as to be continuous with the groove 11 and the primary conductor 3 is arranged along the groove 11 and the guide hole 14.

In addition, as shown in FIG. 4, a core 4 which is mounted with a compensating coil 6 by a bobbin 5 is fixed on the inside of the lower-part case member 2. The compensating coil 6 is wound around the bobbin 5. The lower-part case member 2 has a substantially square plate flat bottom surface portions 2a and four substantially-flat plate-shaped side surface portions 2b which stand upright and extend from the bottom surface portion 2a. The core 4 mounted with the bobbin 5 and the compensating coil 6 is fitted between the side surface portions 2b, is arranged substantially parallel with respect to the bottom surface portion 2a of the lower-part case member 2 and is fixed on the lower-part case member 2.

In this example 1, the core 4 is fixed directly on the lower-part case member 2, but it is allowed to fix the core 4 indirectly on the lower-part case member 2 by using a separate attaching member. It should be noted that it is also allowed for the core 4 to be provided so as to be fixed on the lower-part case member 2 by an adhesive agent.

Figure 5:
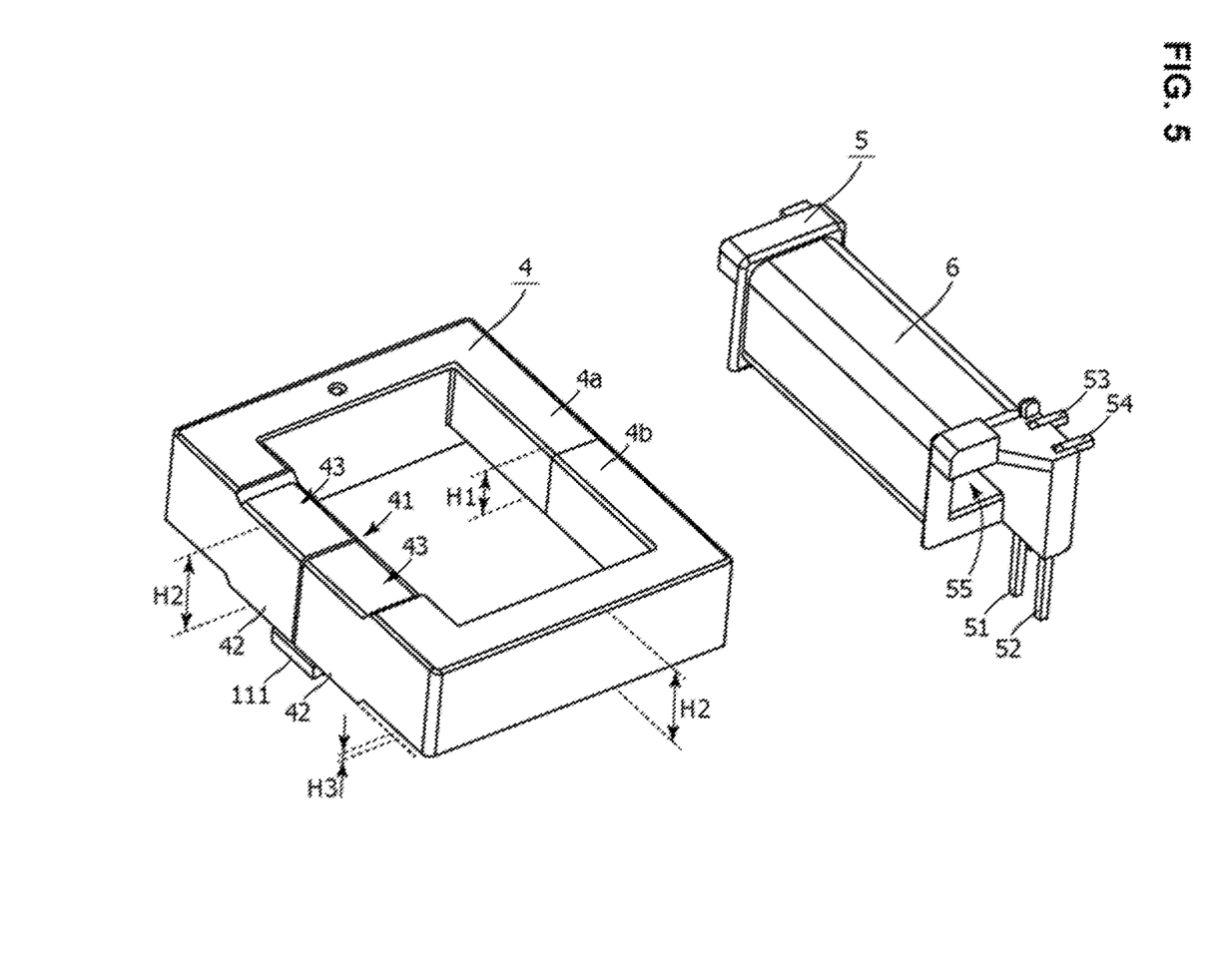
FIG. 5 is a perspective view showing a core 4 and a compensating coil 6 of the electric current detector shown in FIG. 1.

FIG. 5 is a perspective view showing a core 4 and a compensating coil 6 of the electric current detector shown in FIG. 1.

The core 4 is substantially a ring-shaped core which forms a magnetic-path for the magnetic flux Tp induced by the detection-target electric current Ip. In this example, the core 4 includes a plurality of core members 4a, 4b which are UU-cores. Between one end surface of the core member 4a and one end surface of the core member 4b, there exists a gap 41 and the other end surface of the core member 4a and the other end surface of the core member 4b are joined each other.

The two end surfaces which constitute the gap 41 in the core are formed substantially perpendicularly with respect to the magnetic-path formed by the core 4 and thus, are formed substantially perpendicularly with respect to the bottom surface portion 2a of the lower-part case member 2.

In addition, each of one leg portions of the core members 4a, 4b which form the gap 41 includes a protrusion portion 42 protruding toward the lower side (bottom surface side) and concurrently, includes a cut-out portion 43 having substantially the same shape as that of the protrusion portion 42.

In addition, in this example 1, the width H1 in the height direction of the other leg portion of the core member 4a, 4b including the joint surface is formed to be narrower than the width H2 of other portions of the core member 4a, 4b. Thus, there can be obtained a configuration in which the bottom surfaces of the bobbin 5 and the compensating coil 6 will not protrude from the bottom surface of the core 4 when the bobbin 5 and compensating coil 6 are mounted on the core 4, and this configuration contributes to the low-profile of the aforesaid electric current detector.

It should be noted that it is allowed to form the width H1 in the height direction of the other leg portion of the core member 4a, 4b including the joint surface to be identical with the width H2 of other portions. In that case, for example, it is enough if the protrusion height H3 of the protrusion portion 42 is made to increase corresponding to the protrusion height of the bobbin 5 and that of the compensating coil 6 from the bottom surface of the core 4.

In this example, the core 4 is a ferrite core. As shown in FIG. 5, the shape of the core 4 is not complicated and therefore, it is possible to manufacture the core member 4a, 4b by a ferrite material easily. It is possible for this ferrite material to use a Mn—Zn-based ferrite material, a Ni—Zn-based ferrite material or the like and it is preferable for an aspect of permeability to use a Mn—Zn-based ferrite material. It should be noted that the magnetic material of the core 4 is not to be limited by the ferrite material.

For example, in a case in which a complicated core shape becomes necessary like the core described in the Patent Document 1 (Japanese unexamined PCT publication No. 2011-510318), it is required to use a material such as permalloy, amorphous alloy or the like which is excellent in processability but expensive. On the contrary, in this example, it is possible to manufacture the aforesaid electric current detector in low cost by forming the core 4 by a ferrite core. It should be noted that in the case of a ferrite core, the magnetic flux density is non-linear with respect to the magnetic-field strength (that is, detection-target electric current), but the magnetic flux density in the core 4 on an occasion of the electric current detection will decrease by detecting the electric current based on a magnetic balance system, so that there will be no problem in particular.

The core 4 is substantially a ring-shaped core which forms a magnetic-path for the magnetic flux Tp induced by the detection-target electric current Ip. In this example, the core 4 includes a plurality of core members 4a, 4b which are UU-cores. Between one end surface of the core member 4a and one end surface of the core member 4b, there exists a gap 41 and the other end surface of the core member 4a and the other end surface of the core member 4b are joined each other.

The bobbin 5 is a resin-made bobbin and includes terminals 51, 52, 53, 54 which are connected to the compensating coil 6 electrically. The terminals 51, 53 are connected to one end of the compensating coil 6 electrically and the terminals 52, 54 are connected to other end of the compensating coil 6 electrically. The bobbin 5 has an opening portion 55 and the compensating coil 6 is mounted on the core 4 by passing the respective one leg portions of the core members 4a, 4b through the opening portion 55.

In order to detect the electric current by the magnetic balance system, the compensating coil 6 induces, in the core 4, a magnetic flux Tc for cancelling the magnetic flux Tp which is induced in the core 4 by the electric current Ip in the primary conductor 3. The compensating coil 6 induces the magnetic flux Tc in the core 4 by the electric current inputted by using the terminals 51 to 54.

In addition, as shown in FIG. 2, the lower-part case member 2 includes fixing protrusions 21 for fixing the aforesaid electric current detector onto a circuit board, which will be mentioned later. In other words, the lower-part case member 2 supports the core 4 and concurrently, functions as a support member which is mountable onto a circuit board. Further, the lower-part case member 2 includes an opening portion 22 on the lower side of the arrangement position of the gap 41 of the core 4. Thus, the peripheries of the gap 41 of the core 4 are exposed from the opening portion 22. In addition, as shown in FIG. 4, the lower-part case member 2 includes a guide cylinder 23 which stands upright from the inner bottom surface thereof. The hollow portion of the guide cylinder 23 penetrates the bottom surface portion 2a of the lower-part case member 2 and when mounting the upper-part case member 1 on the lower-part case member 2, the guiding convex portion 13 of the upper-part case member 1 is inserted into the hollow portion of the guide cylinder 23 in which the distal end of the guiding convex portion 13 is exposed as shown in FIG. 2.

Thus, the primary conductors 3 are arranged along the guide holes 14 of the guiding convex portion 13 and therefore, the primary conductors 3 are interlinked with the core 4.

Figure 6:
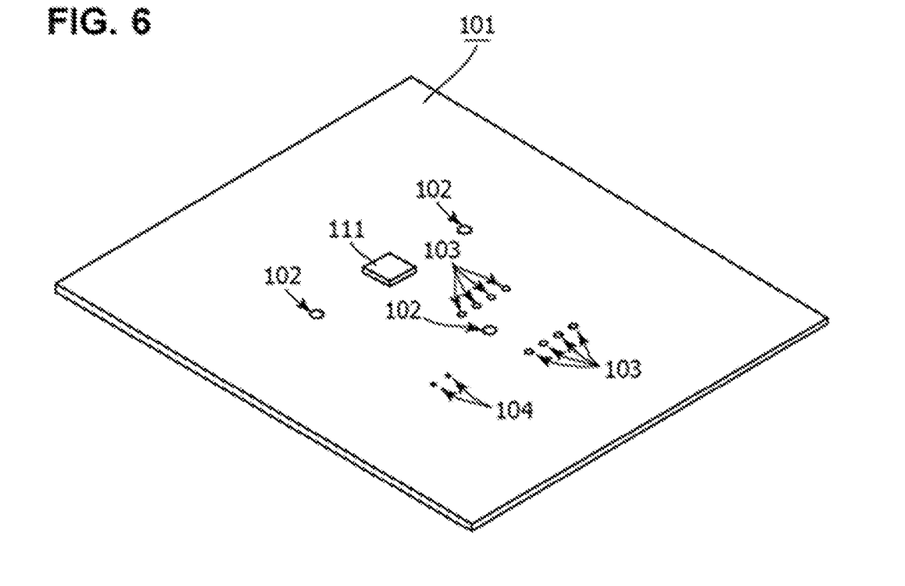
FIG. 6 is a perspective view showing one example of a circuit board which is mounted with the electric current detector relating to the example 1.

FIG. 6 is a perspective view showing one example of a circuit board which is mounted with the electric current detector relating to the example 1. As shown in FIG. 6, a circuit board 101 is mounted with a magnetic sensor IC (Integrated Circuit) chip 111 at a predetermined position and further, includes fixing holes 102 at the positions corresponding to those of the fixing protrusions 21. In addition, the circuit board 101 includes holes 103 for passing the primary conductors 3 therethrough and holes 104 for passing the terminals 51, 52 therethrough.

It should be noted in this example 1 that the electric current detector is mounted and fixed on the circuit board 101 by the fixing protrusions 21 and the fixing holes 102, but it is allowed to employ a configuration in which holes are formed instead of the fixing protrusions 21 and those holes and the fixing holes 102 are to be connected by means of other separate members such as spacers or the like so as to be fixed mutually.

The magnetic sensor IC chip 111 is a fluxgate-type magnetic sensor IC chip which detects magnetic flux for the electric current detection. For example, this magnetic sensor IC chip 111 has a built-in fluxgate-type magnetic sensor which is described in the Patent Document 2 (US unexamined patent publication No. 2014/0218018).

The magnetic sensor IC chip 111 is, for example, soldered onto a wiring pattern (not shown) on the circuit board 101 and thus, the chip is fixed on the circuit board 101. This magnetic sensor IC chip 111 detects the magnetic flux which is in parallel with the mounting face (that is, in parallel with the bottom surface and the upper surface of the package of the magnetic sensor IC chip 111).

The magnetic sensor IC chip 111 is fixed at a predetermined position with respect to the fixing holes 102 in consideration of the positional relation between the fixing protrusions 21 of the above-mentioned electric current detector and the gap 41 of the core 4 such that the magnetic sensor IC chip 111 will be arranged immediately under the gap 41 of the core 4 when mounting the above-mentioned electric current detector on the circuit board 101.

In other words, when the aforesaid electric current detector is mounted on the circuit board 101, the gap 41 is arranged at a place which is in contact with the upper surface of the magnetic sensor IC chip 111 in the magnetic-path formed by the core 4 or which is positioned on the upper side of the magnetic sensor IC chip 111 therein.

In addition, as shown in FIG. 5, there is employed a configuration in which the distance between the gap 41 and the magnetic sensor IC chip 111 when mounting the aforesaid electric current detector on the circuit board by the protrusion portion 42 of the core 4 will decrease, so that it becomes a state in which the magnetic sensor IC chip 111 can easily detect the leakage magnetic flux caused by the gap 41.

Further, in the aforesaid electric current detector, the core 4 is fixed substantially parallel with respect to the bottom surface portion 2a of the lower-part case member and in addition, the bottom surface portion 2a and the circuit board 101 become substantially parallel with each other when mounting the aforesaid electric current detector on the circuit board 101 (in other words, when mounting the lower-part case member 2 on the circuit board 101). Therefore, the core 4 is arranged so as to become substantially parallel with respect to the circuit board 101, that is, so as to be placed horizontally when mounting the aforesaid electric current detector on the circuit board 101 (in other words, when mounting the lower-part case member 2 on the circuit board 101). Two end surfaces constituting the gap 41 of the core 4 become substantially perpendicular with respect to the circuit board 101 and the magnetic sensor IC chip 111.

Figure 7:
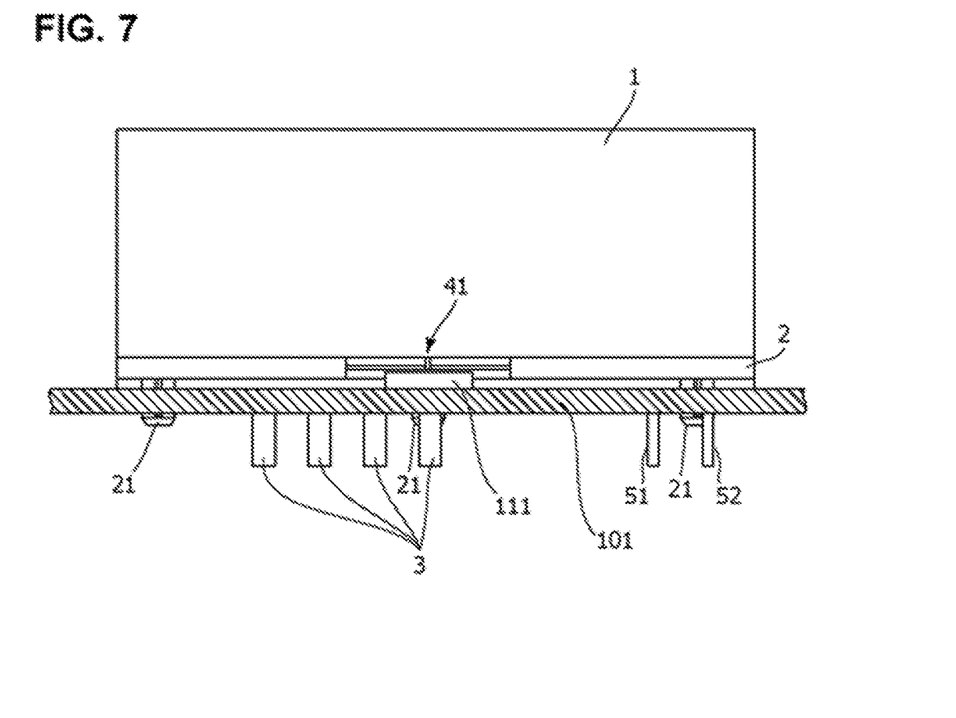
FIG. 7 is a side view showing the electric current detector mounted on a circuit board 101 relating to the example 1.
Figure 8:
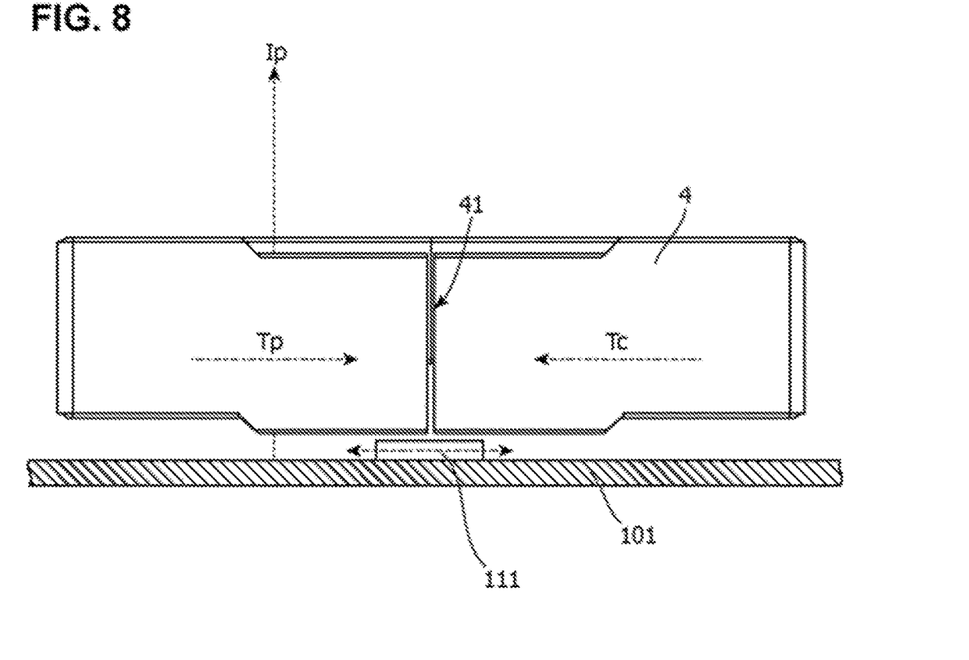
FIG. 8 is a drawing which explains an electric current detection operation of the electric current detector relating to the example 1.

Next, there will be explained an operation of the electric current detector relating to the example 1. FIG. 7 is a side view showing the electric current detector mounted on the circuit board 101 relating to the example 1. FIG. 8 is a drawing which explains an electric current detection operation of the electric current detector relating to the example 1.

As shown in FIG. 7, the electric current detector relating to the example 1 is mounted on the circuit board 101 and circuits and the like which output the detection-target electric current are electrically connected to the primary conductors 3. In addition, an electric-current measurement circuit which drives the compensating coil 6 in response to the magnetic flux detected by the magnetic sensor IC chip 111 is provided on the circuit board 101. That electric-current measurement circuit is electrically connected to the magnetic sensor IC chip 111 and the terminals 51, 52.

As shown in FIG. 8, on an occasion of the electric current detection, the magnetic flux Tp is induced inside the core 4 by the detection-target electric current IP conducting through the primary conductor 3 and the leakage magnetic flux in the vicinity of the gap 41 passes through the magnetic sensor IC chip 111. In this manner, the magnetic flux in response to the detection-target electric current IP is made to conduct through the magnetic sensor IC chip 111. Then, the magnetic sensor IC chip 111 generates a compensation electric current caused by this leakage magnetic flux. Then, the compensating coil 6 induces the magnetic flux Tc inside the core 4 such that based on this compensation electric current, the magnetic flux will become zero. Then, the electric-current value of the detection-target electric current IP is specified based on the electric-current value of the compensating coil 6 when the magnetic flux detected by the magnetic sensor IC chip 111 has become zero.

As mentioned above, the electric current detector relating to the aforesaid example 1 includes the substantially ring-shaped core 4 which is mountable on the circuit board 101 on which there is mounted the fluxgate-type magnetic sensor IC chip 111 which detects the magnetic flux for the electric current detection, and which forms the magnetic-path for the magnetic flux induced by the detection-target electric current. Then, the core 4 includes the gap 41 which is arranged to become substantially parallel with respect to the circuit board 101 when mounting the aforesaid electric current detector on the circuit board 101 and which is at a place positioned on or on the upper side of the magnetic sensor IC chip 111 in the magnetic-path caused by the core 4 when mounting the aforesaid electric current detector on the circuit board 101.

Thus, the gap 41 is arranged in close proximity to the magnetic sensor IC chip 111 which is surface-mounted on the circuit board 101 and the core 4 is placed horizontally and therefore, there can be obtained a low-profile electric current detector.

EXAMPLE 2

An electric current detector relating to an example 2 of the present invention includes similar constituent elements as those of the electric current detector relating to the example 1. However, in the example 2, the upper-part case member 1 and the lower-part case member 2 have magnetic shielding functions.

In the example 2, the upper-part case member 1 and the lower-part case member 2 are formed by a soft magnetic material having high permeability such as permalloy or the like. It should be noted that it is allowed for only the upper-part case member 1 or only the lower-part case member 2 to be formed by the soft magnetic material.

However, a portion of the side surfaces of the upper-part case member 1 and the lower-part case member 2 is formed by a non-magnetic material such that there is not formed a circulating magnetic-path with respect to the primary conductors 3. Similarly, a portion of the upper surface of the upper-part case member 1 and the bottom surface of the lower-part case member 2 is formed by a non-magnetic material such that there is not formed a circulating magnetic-path with respect to the primary conductors 3. For example, for the upper-part case member 1 and the lower-part case member 2, predetermined portions thereof which extend substantially perpendicularly with respect to the direction of the circulating magnetic flux caused by the detection-target electric current IP are formed by a non-magnetic material such as a resin or the like.

Even if the upper-part case member 1 and the lower-part case member 2 are formed by a magnetic material in this manner, there are provided an opening portion 22 on the bottom surface portion 2a of the lower-part case member 2 at the arrangement-position of the gap 41 of the core 4 and therefore, the leakage magnetic flux from the gap 41 conducts through the magnetic sensor IC chip 111.

As mentioned above, according to the aforesaid example 2, the upper-part case member 1 and the lower-part case member 2 have magnetic shielding functions and therefore, there will be decreased the influence of the disturbance magnetic flux induced by the electric current which conducts in the vicinity thereof.

EXAMPLE 3

Figure 9:
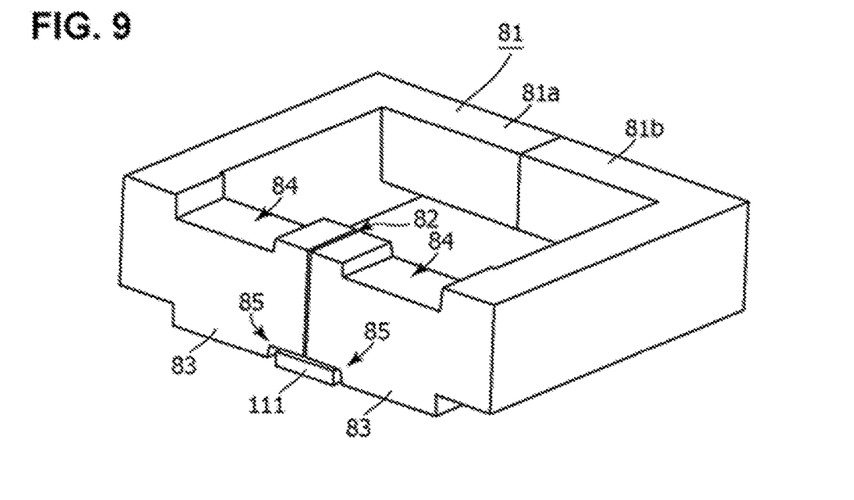
FIG. 9 is a perspective view showing a core of an electric current detector relating to an example 3 of the present invention.

FIG. 9 is a perspective view showing a core of an electric current detector relating to an example 3 of the present invention. The electric current detector relating to the example 3 includes a core 81 as shown in FIG. 9 instead of the core 4. It should be noted that other constitutions of the electric current detector relating to the example 3 are similar to those of the example 1 or the example 2 and therefore, the explanation thereof will be omitted.

In the example 3, the core 81 is a substantially ring-shaped core which forms a magnetic-path for the magnetic flux Tp induced by the detection-target electric current Ip. In this example, the core 81 includes a plurality of core members 81a, 81b which are UU-cores. There exists a gap 82 between one end surface of the core member 81a and one end surface of the core member 81b, in which the other end surface of the core member 81a and the other end surface of the core member 81b are joined each other.

In addition, each of one-side leg portions of the core members 82a, 82b forming the gap 82 includes a protrusion portion 83 which protrudes toward the lower side (bottom surface side) and concurrently, includes a cut-out portion 84 having substantially the same shape as that of the protrusion portion 83. Further, in the example 3, the protrusion portions 83 include cut-out portions 85 which are formed in conformity with the shape of the magnetic sensor IC chip 111. The cut-out portions 85 are formed in a shape for covering a portion of or all of the side surfaces of the magnetic sensor IC chip 111 when the aforesaid electric current detector is mounted on the circuit board 101. For example, the cut-out portion 85 has substantially the same height as the height of the magnetic sensor IC chip 111 (that is, the distance from the surface of the circuit board 101 to the upper surface of the package of the magnetic sensor IC chip 111).

It should be noted that the core 81 shown in FIG. 9 covers the upper surface and two side surfaces of the magnetic sensor IC chip 111, but it is allowed for the core to be formed in a shape which covers the upper surface and four side surfaces of the magnetic sensor IC chip 111.

EXAMPLE 4

Figure 10:
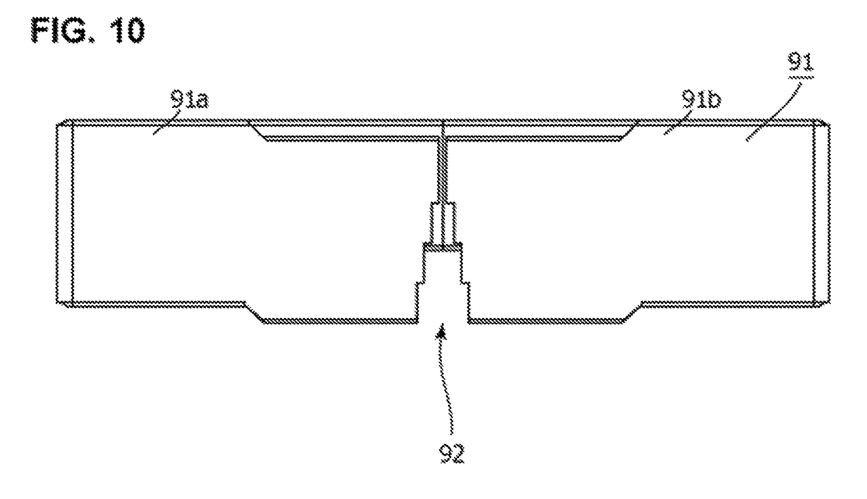
FIG. 10 is a side view showing one example of a core of an electric current detector relating to an example 4 of the present invention.

FIG. 10 is a side view showing one example of a core of an electric current detector relating to an example 4 of the present invention. The electric current detector relating to the example 4 includes a core 91 shown in FIG. 10 instead of the core 4. It should be noted that other constitutions of the electric current detector relating to the example 4 are similar to those of the example 1 or the example 2 and therefore, the explanation thereof will be omitted.

In the example 4, the core 91 is a substantially ring-shaped core which forms a magnetic-path for the magnetic flux Tp induced by the detection-target electric current IP. In this example, the core 91 includes a plurality of core members 91a, 91b which are UU-cores. There exists a gap 92 between one end surface of the core member 91a and one end surface of the core member 91b, in which the other end surface of the core member 91a and the other end surface of the core member 91b are joined each other.

Further, in the example 4, the width of the gap 92 changes along the height direction and the more the gap 92 goes to the bottom surface side of the core 91, the wider the gap becomes. It should be noted that the shapes other than the shape of the gap 92 of the core 91 are similar to those of the core 4.

It should be noted that in the core 91 shown in FIG. 10, the end surfaces of the core members 91a, 91b constituting the gap 92 are formed in step shapes, but it is allowed to form the end surfaces in inclined slope-surface shapes or in curved surface shapes.

EXAMPLE 5

The electric current detector relating to an example 5 of the present invention is a detector which further includes a plate-shaped magnetic shield member for any one of the examples 1 to 4.

Figure 11:
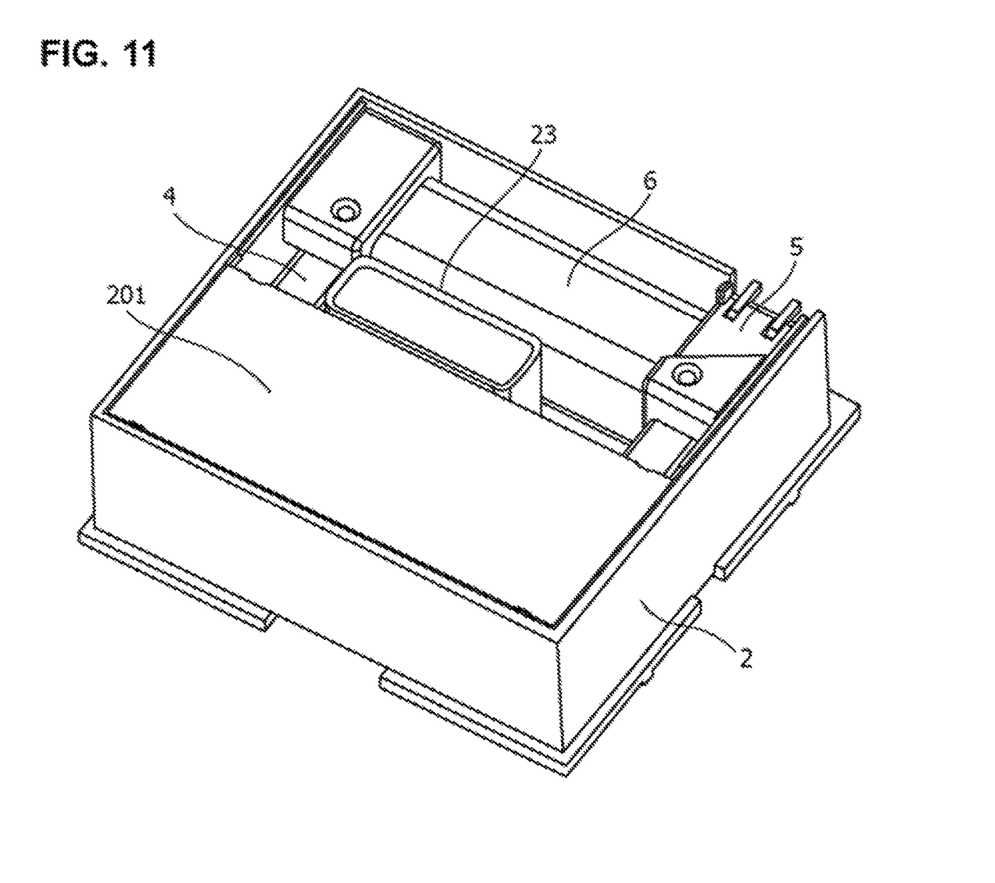
FIG. 11 is a perspective view when the upper-part case member and the primary conductor are removed from an electric current detector relating to an example 5.
Figure 12:
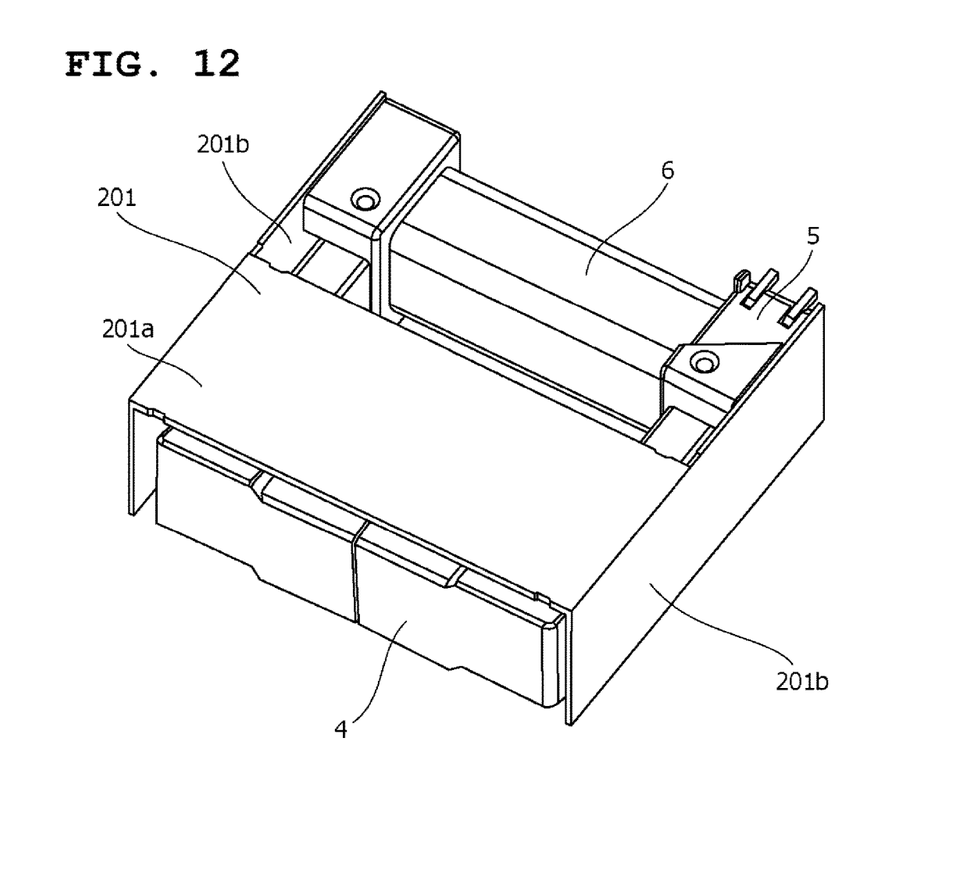
FIG. 12 is a perspective view when the upper-part case member, the lower-part case member and the primary conductor are removed from the electric current detector relating to the example 5.

FIG. 11 is a perspective view when the upper-part case member 1 and the primary conductor 3 are removed from an electric current detector relating to the example 5. FIG. 12 is a perspective view when the upper-part case member, the lower-part case member and the primary conductor are removed from the electric current detector relating to the example 5. It should be noted that other constitutions of the electric current detector relating to the example 5 are similar to any one of those examples 1 to 4 and therefore, the explanation thereof will be omitted.

As shown in FIG. 11 and FIG. 12, a magnetic shield member 201 is arranged between the core 4 and the case (the lower-part case member 2, in other words, the support member of the core 4). It should be noted that the magnetic shield member 201 is arranged apart from the core so as not to contact with the core 4. For example, the magnetic shield member is fixed on the core 4 or the lower-part case member 2 through an adhesive agent, a nonmagnetic member or the like.

As shown in FIG. 12, the magnetic shield member 201 includes a flat plate-shaped top surface portion 201a and two facing flat plate-shaped side surface portions 201b. Each of the side surface portions 201b extends perpendicularly from the top surface portion 201a. In this example 5, the magnetic shield member 201 is constituted by using a single member, but it is allowed to constitute by using a plurality of members (separate members which correspond to the top surface portion 201a and the side surface portions 201b). The magnetic shield member 201 does not interlink with the primary conductors 3. In addition, the top surface portion 201a of the magnetic shield member 201 is arranged on the upper side of the gap 41, 82 or 92 of the core 4, 81 or 91 (that is, upper side of the magnetic sensor IC chip 111) and the side surface portions 201b of the magnetic shield member 201 are arranged on the sides of the gap 41, 82 or 92 of the core 4, 81 or 91 (that is, on the sides of the magnetic sensor IC chip 111).

The magnetic shield member 201 is constituted, for example, by a material such as a ferrite (Ni—Zn-based ferrite, Mn—Zn-based ferrite, Ba-based ferrite, ferox planar ferrite or the like), an amorphous magnetic alloy, a silicon steel sheet, a permalloy, a nanocrystal magnetic alloy or the like.

By providing the magnetic shield member 201 in this manner, there will be decreased the influence of the disturbance magnetic flux induced by the electric current which conducts in the vicinity thereof.

EXAMPLE 6

In a manufacturing method of an electronic equipment relating to an example 6 of the present invention, a first manufacturer manufactures and sells any one of the electric current detectors of the above-mentioned examples 1 to 5; a second manufacturer manufactures and sells the above-mentioned magnetic sensor IC chip 111; and a third manufacturer purchases those electric current detector and magnetic sensor IC chip 111, mounts those electric current detector and magnetic sensor IC chip 111 and the above-mentioned electric-current measurement circuit on the circuit board 101, and manufactures the electronic equipment. At that time, the third manufacturer mounts the above-mentioned electric current detector and electric-current measurement circuit after determining the number of the primary conductors 3 which are serially connected one another, the measurement range of the above-mentioned electric-current measurement circuit and the like in response to the range of the electric-current values of the electric current which becomes a detection target in that electronic equipment.

The electric current detector is constituted in a manner mentioned above and therefore, by forming the above-mentioned fixing hole 103 on the circuit board 101 of the electronic equipment which is manufactured by the third manufacturer in conformity with the positional relation between the fixing protrusion 21 and the gap 41 of that electric current detector and concurrently, by mounting the magnetic sensor IC chip 111 thereon and by mounting that electric current detector onto the circuit board 101, it is possible for the third manufacturer to install the electric current detector simply in the inside of that electronic equipment in conformity with the specification of that electronic equipment.

It should be noted that it is self-evident for a person skilled in the art to apply various changes and modifications with respect to the examples mentioned above. Such changes and modifications may be applied without being apart from the gist and the scope of the main subject thereof and also without reducing the intended advantages. In other words, it is intended that such changes and modifications are to be included within the scope of the claims.

For example, in the aforesaid examples 1 to 5, for the end surfaces joining each other which are respectively different from the end surfaces forming the gap 41, 82 or 92 in the core members 4a and 4b, 81a and 81b or 91a and 91b, it is allowed to employ inclined surfaces or step-shaped surfaces other than the end surfaces substantially perpendicular with respect to the magnetic-path such as shown in FIG. 5. In addition, it is allowed to join those end surfaces each other by a magnetic adhesive agent.

In addition, in the aforesaid examples 1 to 5, it is allowed to arrange a nonmagnetic spacer in the gap 41, 82 or 92, or it is allowed to fill a nonmagnetic adhesive agent or a filler material therein. In addition, it is allowed to fill a soft magnetic adhesive agent or a filler material in a portion of the gap 41, 82 or 92 on the upper surface side of the core 4, 81 or 91 (in a space between a portion of one end surface and a portion of the other end surface, which constitute the gap 41, 82 or 92.

In addition, in the aforesaid examples 1 to 5, in order to decrease the influence of disturbance, it is allowed to arrange a magnetic sheet of a soft magnetic material between the circuit board 101 and the magnetic sensor IC chip 111, to paste a magnetic sheet of a soft magnetic material on the rear surface of the circuit board 101 (the surface on the opposite side of the mounting face of the magnetic sensor IC chip 111), and so on. In addition, it is allowed for the circuit board 101 to use a circuit board including a magnetic layer having a soft magnetic material.

In addition, in the aforesaid examples 1 to 5, the core 4, 81 or 91 is constituted by the two symmetrical core members 4a and 4b, 81a and 81b or 91a and 91b, but it is allowed to constitute the core by using a plurality of asymmetrical core members. In addition, in the aforesaid example 1 to 3, it is allowed for the core 4, 81 or 91 to be constituted by a single core member having a gap. It should be noted that the core 4, 81 or 91 is constituted by the two symmetrical core members 4a and 4b, 81a and 81b or 91a and 91b, so that the gap 41, 82 or 92 is arranged at the center position, but in the case of using a plurality of asymmetrical core members, it is allowed for the gap 41, 82 or 92 not to be arranged at the center position.

In addition, in the aforesaid examples 1 to 5, the electric-current value is detected based on a magnetic balance system, but it is allowed to detect the electric-current value based on a magnetic proportion system. In that case, it is allowed not to provide the bobbin 5, the compensating coil 6 and the like.

The present invention is applicable, for example, to an electric current sensor.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An electric current detector which is mountable on a circuit board on which a fluxgate-type magnetic sensor IC chip is mountable, the electric current detector comprising:
   a split-ring core which forms a magnetic-path for magnetic flux induced by a detection-target electric current, the core having a gap between two end faces of the core;
   a primary conductor which is interlinked with the core, the detection-target electric current flowing through the primary conductor; and
   a compensating coil which is provided adjacent to the core, the compensating coil inducing magnetic flux inside the core for cancelling magnetic flux induced inside the core by the electric current flowing through the primary conductor, wherein
   a bottom surface of the core is substantially parallel to the circuit board when the electric current detector is mounted on the circuit board, and
   the magnetic sensor IC chip spans the gap in the magnetic-path in a plan view when the electric current detector is mounted on the circuit board.

2. The electric current detector according to claim 1, further comprising:
   a support member mountable on the circuit board, wherein
   the core is fixed directly or indirectly on the support member, and
   the magnetic sensor IC chip spans the gap in the magnetic-path in the plan view when the support member is mounted on the circuit board.

3. The electric current detector according to claim 1, wherein the two end faces of the core are substantially perpendicular to the circuit board.

4. The electric current detector according to claim 1, further comprising:
   a support member mountable on the circuit board, wherein
   the support member configures at least part of a case which houses the core,
   the case is magnetic shielding, and
   the case includes an opening on a bottom surface of the case, and the opening and the gap in the core overlap each other in the plan view.

5. The electric current detector according to claim 1, further comprising:
   a support member mountable on the circuit board; and
   a plate-shaped magnetic shield member, wherein
   the support member configures at least part of a case which houses the core, and
   the magnetic shield member is arranged between the core and the case.

6. The electric current detector according to claim 1, wherein the core is a ferrite core.

7. An electric current detection sensor comprising:
   a circuit board;
   a sensor IC chip that is mounted on the circuit board; and
   an electric current detector, the electric current detector including:
      a split-ring core that is provided above the circuit board, the core being configured to form a magnetic-path for magnetic flux induced by a detection-target electric current, the core having a gap between two end faces of the core;
      a primary conductor that is interlinked with the core, the detection-target electric current flowing through the primary conductor; and
      a compensating coil that is provided adjacent to the core, the compensating coil inducing magnetic flux inside the core for cancelling magnetic flux induced inside the core by the electric current flowing through the primary conductor,
   wherein a bottom surface of the core is substantially parallel to the circuit board, and
   the sensor IC chip spans the gap in the magnetic-path in a plan view.

8. The electric current detection sensor according to claim 7, further comprising:
   a support member that is mounted on the circuit board, wherein the core is fixed directly or indirectly on the support member.

9. The electric current detection sensor according to claim 7, wherein the two end faces of the core are substantially perpendicular to the circuit board.

10. The electric current detection sensor according to claim 7, further comprising:
    a support member that is mounted on the circuit board, wherein the support member configures at least part of a case which houses the core,
    the case has a magnetic shielding function, and
    the case includes an opening on a bottom surface of the case, and the opening and the gap in the core are overlapped to each other in the plan view.

11. The electric current detection sensor according to claim 7, further comprising:
    a support member that is mounted on the circuit board; and
    a plate-shaped magnetic shield member,
    wherein the support member configures at least part of a case which houses the core, and
    the magnetic shield member is arranged between the core and the case.

12. The electric current detection sensor according to claim 7, wherein the core is a ferrite core.

13. The electric current detection sensor according claim 7, wherein the sensor IC chip is a fluxgate-type magnetic sensor IC chip.

* * * * *